US005723073A

United States Patent [19]
Fukuta et al.

[11] Patent Number: 5,723,073
[45] Date of Patent: Mar. 3, 1998

[54] CONDUCTIVE PASTE CONTAINING 2-TETRADECANOL AND CERAMIC CIRCUIT SUBSTRATE USING THE SAME

[75] Inventors: Junzo Fukuta; Toshihiro Nakai, both of Nagoya, Japan

[73] Assignee: Sumitomo Metal (SMI) Electronics Devices Inc., Yamaguchi, Japan

[21] Appl. No.: 590,518

[22] Filed: Mar. 6, 1996

[30] Foreign Application Priority Data

Mar. 30, 1995 [JP] Japan .................................. 7-073541

[51] Int. Cl.⁶ ............................... H01B 1/20; H01B 1/22
[52] U.S. Cl. ........................ 252/514; 252/518; 252/519; 106/1.13; 106/1.14
[58] Field of Search ............................. 252/514, 518, 252/519; 106/1.13, 1.14

[56] References Cited

U.S. PATENT DOCUMENTS

| | | | |
|---|---|---|---|
| 4,636,332 | 1/1987 | Craig et al. | 252/514 |
| 5,395,876 | 3/1995 | Frentzel et al. | 524/440 |

FOREIGN PATENT DOCUMENTS

| | | |
|---|---|---|
| 1-138793 | 5/1989 | Japan . |
| 2-277279 | 11/1990 | Japan . |

*Primary Examiner*—Paul Lieberman
*Assistant Examiner*—Mark Kopec
*Attorney, Agent, or Firm*—Flynn, Thiel, Boutell & Tanis, P.C.

[57] ABSTRACT

A conductive paste for filling through holes for the interlayer electrical connection in a low-temperature firable ceramic circuit substrate to be fired at 800° to 1,000° C., which comprises a) 100 parts by weight of flaky and/or spherical silver-based powder particles; b) 0.1 to 2.0 parts by weight of $b_1$) $Sb_2O_3$ or a substance which is converted into $Sb_2O_3$ by the firing and the amount of which is given in terms of $Sb_2O_3$ and/or $b_2$) Rh powder; and c) at least 3 parts by weight of 2-tetradecanol. The conductive paste has excellent printing properties and homogeneity because the viscosity change thereof is only small when it is printed into through holes of a ceramic circuit substrate and the crack formation after the firing is slight. Thus, the conductive paste is effective for efficient production of a ceramic circuit substrate of a high density wiring. The conductive paste may contain at least one organic resin selected from the group consisting of ethylcellulose, hydroxyethylcellulose and an acrylic resin.

10 Claims, No Drawings

CONDUCTIVE PASTE CONTAINING 2-TETRADECANOL AND CERAMIC CIRCUIT SUBSTRATE USING THE SAME

BACKGROUND OF THE INVENTION

1. Field of the Invention

The present invention relates to a conductive paste having excellent printing properties and which is used for filling through holes of a ceramic circuit substrate by printing, and a ceramic circuit substrate produced using the paste.

2. Description of the Prior Art

A multilayer ceramic circuit substrate is produced, for example, by screen-printing a conductive paste onto a fired ceramic or unfired green sheet substrate for wiring, then printing an insulating paste thereon for forming an insulating layer having through holes, drying the paste, suitably repeating these processes and firing the product. In this process, the through holes are filled with a conductive paste in order to electrically connect the conductor layers formed on the insulating layers. Alternatively, when the multilayer ceramic circuit substrate is produced by a green sheet laminating process, through holes are formed in a green sheet for the electrical interlayer connections, a conductive paste is filled into the through holes by screen printing and is also printed onto the wiring part of the green sheet. In such a manner, a desired number of green sheets having through holes are printed, laminated together under pressure and fired to obtain the laminate. If necessary, a resistor paste, protector paste, etc. are used in addition to the conductive paste and insulating pastes. They are used mainly for the printing technique, and they are generically called "thick-film pastes".

The conductive paste is usually prepared by adding a conductive powder such as a metal powder to a mixture called "a vehicle" and comprising an organic resin and a solvent. An ordinary vehicle comprises an organic resin as a binder and butylcarbitol acetate or α-terpineol as the solvent.

Since the coefficient of shrinkage and coefficient of thermal expansion of the silver powder used as the conductive powder are not the same as those of the ceramic, the internal stress thus caused is relieved by coarsening the conductor tissue by using flaky silver particles or by adding an additive such as $Sb_2O_3$, Rh or the like as described in Japanese Patent Laid-Open Nos. 1-138793 and 2-277279. When the conductor tissue is dense, cracks are formed around the through holes in the ceramic by a difference in the coefficient of thermal expansion between silver and the ceramic.

The through holes in the ceramic green sheet are filled with the conductive substance by dispersing the conductive particles in the organic vehicle to form a paste and filling the through holes with the paste by a screen printing technique. For stable screen printing, it is important that the viscosity of the paste is unchanged or substantially unchanged. In other words, when the viscosity increases, the clogging of the screen is caused during the course of the printing to break the wiring.

Recently, however, it has been desirable to provide an exhaust apparatus at the position of formation of the organic solvent vapor, since the gaseous organic solvent in the organic vehicle might exert an adverse influence on the safety and hygiene of human bodies. Further, air is exhausted below the vias in order to completely fill the through holes with the paste during the course of printing. The amount of the solvent evaporated from the conductor paste is thus increased by these two causes in the printing step to increase the viscosity change and thereby to make the amount of the paste to be put into the holes nonuniform during the continuous printing.

SUMMARY OF THE INVENTION

An object of the present invention is to provide a conductive paste for filling the through holes of the ceramic circuit substrate, which has excellent printing properties, i.e., only a slight viscosity change and a uniform amount filled in the through holes in the course of the printing.

After intensive investigations, the inventors have found that the above-described object can be attained by incorporating a specified compound as the organic solvent into the conductive paste. The present invention has been achieved on the basis of this finding.

Namely, the present invention provides a conductive paste and a low-temperature fired ceramic circuit substrate using the paste, described in the following items (1) to (4):

(1) A conductive paste for filling through holes for an interlayer electrical connection in a low-temperature firable ceramic circuit substrate to be fired at 800° to 1,000° C., which comprises:
  a) 100 parts by weight of flaky and/or spherical silver-based powder particles;
  b) 0.1 to 2.0 parts by weight of $b_1$) $Sb_2O_3$ or a substance which is converted into $Sb_2O_3$ by the firing and the amount of which is given in terms of $Sb_2O_3$ and/or $b_2$) Rh powder; and
  c) at least 3 parts by weight of 2-tetradecanol.

(2) The conductive paste according to the above item (1), which contains at least one organic resin selected from the group consisting of ethylcellulose, hydroxyethylcellulose and an acrylic resin.

(3) A low-temperature fired ceramic circuit substrate fired at 800° to 1,000° C., wherein through holes formed in the substrate have been filled with the conductive paste as set forth in the above item (1) or (2) and fired with the paste.

(4) The conductive paste or low-temperature fired ceramic circuit substrate according to the above item (1) or (3), wherein the low-temperature firable ceramic material used in the substrate comprises a $CaO-Al_2O_3-SiO_2-B_2O_3$ system or $MgO-Al_2O_3-SiO_2-B_2O_3$ system glass and alumina.

DETAILED DESCRIPTION OF THE PREFERRED EMBODIMENTS

According to the present invention, the Ag-based paste only slightly evaporates to cause substantially no change in its viscosity in the course of printing and which has a high safety and productivity can be obtained. Namely, such an Ag-based paste can be obtained by using an organic vehicle for the conductive paste for filling the through holes, the vehicle comprising at least one resin component selected from the group consisting of ethylcellulose, hydroxyethylcellulose and an acrylic resin and at least 3 parts by weight, based on the total paste components, of 2-tetradecanol as the organic solvent and, if necessary, another solvent by a process of a high productivity (i.e. the process wherein air is sucked below the green sheet to make the filling of the through holes with the paste complete) in an environment having a sufficient safety for human bodies (i.e. under a sufficient exhaustion of gas).

2-Tetradecanol (isotetradecanol) used as the solvent or as part of the solvent for forming the thick film-forming paste in the present invention has a higher boiling point and a lower evaporation rate than other solvents as shown in Table 1. The evaporation rate given in Table 1 is determined by feeding the solvent into a vessel having a liquid surface area of 1 cm$^2$, allowing the solvent to stand at a test temperature for a predetermined period of time and determining the evaporation rate.

TABLE 1

| | Evaporation Rate of Solvent | | |
|---|---|---|---|
| Solvent | Boiling point (°C.) | Evaporation rate (g/cm$^2$ · Hr) | |
| | | 80° C. | 100° C. |
| 2-Tetradecanol | 276 | 0.5 | 3.6 |
| Butylcarbitol acetate | 247 | 2.5 | 7.6 |
| α-Terpineol | 213 | 7.5 | 16.5 |

In the present invention, at least 3 parts by weight, preferably at least 5 parts by weight, of 2-tetradecanol is contained as the organic solvent in the thick film-forming paste. When the amount of 2-tetradecanol is below 3 parts by weight, the object and effect of the present invention cannot be sufficiently attained. The whole solvent may be composed of only 2-tetradecanol. In this case, the balance is composed of the desired silver-based powder, $Sb_2O_3$, Rh powder and the like and the resin component. The solvents usable in combination with 2-tetradecanol include conventional solvents such as butylcarbitol acetate and α-terpineol. These examples of solvents by no means limit the solvents usable in the present invention. The resin component of the vehicle is at least one of conventional resins including ethylcellulose, polyvinylbutyral and an acrylic resin.

Although a desired amount of the solvent component is used for controlling the viscosity of the printing paste, the amount of the total solvent components is preferably at least 10 parts by weight for obtaining the paste having excellent printing properties. The amount of the resin component is preferably 1 to 8 parts by weight.

The term "a substance which is converted into $Sb_2O_3$ by the firing and which is one of the components of the paste of the present invention" indicates metallic Sb powder or an organic Sb compound such as a Sb resinate.

The ceramic materials usable for forming the low-temperature firable ceramic circuit substrate are not particularly limited and include those which can be fired at a temperature of 800° to 1,000° C. A low-temperature firable ceramic, which comprises an alumina ceramic containing a glass powder, is usable. For example, a ceramic material comprising a $CaO-Al_2O_3-SiO_2-B_2O_3$ system or $MgO-Al_2O_3-SiO_2-B_2O_3$ system glass and alumina is usable.

The ceramic circuit substrate having the through holes to be filled with the conductive paste of the present invention may have either a single layer or multiple layers so far as the low-temperature firable ceramic is usable for the insulator. The multilayer ceramic circuit substrate is produced by either a thick-film multilayer printing process or a green sheet laminating process. Either a two-sided or one-sided circuit substrate may be used so far as it has through holes.

A description will now be made for the above-mentioned two processes of forming the multilayer ceramic circuit substrate. In the thick-film multilayer printing process, a conductive paste and an insulating paste are alternately screen printed on a ceramic substrate fired at a low temperature and then fired to produce a multilayer ceramic circuit substrate. If necessary, a resistor layer can be formed by screen printing. An Ag-based or Cu-based paste is usually used as a conductive material. The fired ceramic substrate can be replaced with a ceramic green sheet. In the green sheet laminating process, registration holes and through holes are formed in each green sheet, the through holes are filled with the conductive paste. Further, a wiring conductor paste is printed on each green sheet, and all the printed green sheets are hot-pressed into a laminate of the green sheets to obtain an integrated structure and cofired.

The following Examples and Comparative Examples will further illustrate the present invention.

EXAMPLE 1

A $CaO-Al_2O_3-SiO_2-B_2O_3$ system glass powder, α-$Al_2O_3$ powder, an acrylic resin and an organic solvent such as toluene or ethanol were mixed together in a ball mill, and then ceramic green sheets having a thickness of 0.3 mm were produced from the mixture by a doctor blade process.

A conductive paste was prepared by mixing 100 parts by weight of flaky Ag powder particles having an average size of 5 μm, 0.2 part by weight of $Sb_2O_3$, and a vehicle prepared by dissolving 1.5 parts by weight of ethylcellulose in a mixture of 10 parts by weight of 2-tetradecanol and 2 parts by weight of butylcarbitol acetate with a three-roll mill. A paste having a predetermined viscosity was obtained (paste 1).

Green sheets cut into a predetermined size and having through holes of a diameter of 0.25 mm were used. 1000 green sheets were continuously printed with the conductive paste by means of an ordinary screen printing machine. The viscosity of the paste was determined before and after the printing to determine the changing rate thereof. Further, crack formation in the portions around the through holes on the printed surface was checked. The viscosity was increased by 8% from 2370 poise (before the printing) to 2550 poise (after the printing). No cracks were found around the through holes. The number of rejects in which the filling of the through holes was insufficient was given for 10,000 samples.

EXAMPLES 2 TO 4

Pastes 2 to 4 were prepared in the same manner as that of Example 1 except that the inorganic powder, and the organic resin component and organic solvent constituting the vehicle were changed as given in Table 2 and then the same experiment as that of Example 1 was conducted.

COMPARATIVE EXAMPLES 1 AND 2

The same experiment as that described above was repeated except that 2-tetradecanol as the organic solvent was replaced with 18 parts by weight of terpineol ordinarily used as the solvent and the amount of ethylcellulose was altered to 2 parts by weight in Comparative Example 1, and 18 parts by weight of butylcarbitol acetate was used as the organic solvent and no additive was used in Comparative Example 2. The results of the evaluation of the printing properties and examination of the crack formation around the through holes are also given in Table 3.

TABLE 2

Paste Composition

| | Paste No. | Conductive powder (parts by wt.) | | Additive (parts by wt.) | | Organic resin (parts by wt.) | | Organic solvent (parts by wt.) | |
|---|---|---|---|---|---|---|---|---|---|
| Ex. 1 | 1 | flaky Ag | 100 | $Sb_2O_3$ | 0.2 | ethylcellulose | 1.5 | butylcarbitol acetate | 2 |
| | | | | | | | | 2-tetradecanol | 10 |
| Ex. 2 | 2 | spherical Ag | 100 | Rh | 1.0 | ethylcellulose | 5 | 2-tetradecanol | 19 |
| Ex. 3 | 3 | flaky Ag | 20 | $Sb_2O_3$ | 0.5 | hydroxyethyl | | | |
| | | spherical Ag | 80 | | | cellulose | 2.5 | 2-tetradecanol | 3 |
| | | | | | | | | butylcarbitol acetate | 15 |
| Ex. 4 | 4 | spherical Ag | 100 | $Sb_2O_3$ | 1.0 | acrylic resin | 8 | 2-tetradecanol | 12 |
| | | | | Rh | 0.6 | | | α-terpineol | 5 |
| Comp. Ex. 1 | 5 | spherical Ag | 100 | $Sb_2O_3$ | 0.5 | ethylcellulose | 2.0 | terpineol | 18 |
| Comp. Ex. 2 | 6 | spherical Ag | 100 | none | | ethylcellulose | 2.0 | butylcarbitol acetate | 18 |

TABLE 3

Evaluation of Printing Properties and Reliability after Firing

| Paste No. | Viscosity changing rate* | | | Number of rejects of insufficient filling of through hole (for 10,000) | Cracks around through hole after firing |
|---|---|---|---|---|---|
| | before printing (P) | after printing (P) | changing rate (%) | | |
| 1 | 2370 | 2550 | +8 | 0 | none |
| 2 | 2650 | 2870 | +8 | 0 | none |
| 3 | 2510 | 2800 | +12 | 0 | none |
| 4 | 1255 | 1416 | +13 | 0 | none |
| 5 | 2490 | 3590 | +44 | 10 | none |
| 6 | 2460 | 3200 | +30 | 14 | found |

*Viscosity changing rate after continuous screen printing to produce 1,000 prints.
"+" indicates the increase.
"P" means poise.
Viscosity changing rate = |(viscosity after printing) − (viscosity before printing)| / (viscosity before printing) × 100

As described above, the conductive paste of the present invention has excellent printing properties and homogeneity because the viscosity change thereof is only small when it is printed as a filler material into through holes of a ceramic circuit substrate, and the crack formation after the firing is slight. Thus, the conductive paste is effective for the efficient production of a ceramic circuit substrate of a high density wiring.

What is claimed is:

1. An electrically conductive paste for filling through holes for an interlayer electrical connection in a low-temperature firable ceramic circuit substrate to be fired at 800° to 1.000° C., which comprises:

a) 100 parts by weight of at least one member selected from the group consisting of flaky and spherical silver-based powder particles;

b) 0.1 to 2.0 parts by weight of at least one member selected from the group consisting of $b_1$) $Sb_2O_3$, or a substance which is converted into $Sb_2O_3$ by firing wherein the amount of said substance is given in terms of $Sb_2O_3$, and $b_2$) Rh powder; and c) at least 3 parts by weight of 2-tetradecanol.

2. The electrically conductive paste according to claim 1, which contains at least one organic resin selected from the group consisting of ethylcellulose, hydroxyethylcellulose and an acrylic resin.

3. The electrically conductive paste according to claim 1, Wherein the low-temperature firable ceramic circuit substrate comprises a $CaO-Al_2O_3-SiO_2-B_2O_3$ system or $MgO-Al_2O_3-SiO_2-B_2O_3$ system glass and alumina.

4. The electrically conductive paste according to claim 1, wherein 2-tetradecanol is present in an amount of at least 5 parts by weight.

5. The electrically conductive paste according to claim 1, comprising 100 parts by weight of flaky Ag powder, 0.2 part by weight $Sb_2O_3$, 1.5 parts by weight of ethylcellulose, 10 parts by weight of 2-tetradecanol and 2 parts by weight of butyl carbitol acetate.

6. The electrically conductive paste according to claim 1, comprising 100 parts by weight of spherical Ag powder, 1.0 part by weight Rh, 5 parts by weight ethylcellulose and 19 parts by weight 2-tetradecanol.

7. The electrically conductive paste according to claim 1, comprising 0.1–2 parts by weight of $Sb_2O_3$ or a substance which is converted into $Sb_2O_3$ by firing wherein the amount of said substance is given in terms of $Sb_2O_3$.

8. The electrically conductive paste according to claim 1, comprising 0.1–2 parts by weight Rh.

9. The electrically conductive paste according to claim 1, additionally comprising an acrylic resin.

10. The electrically conductive paste of claim 1, wherein 2-tetradecanol is present in an amount of from 3–19 parts by weight.

* * * * *